(12) United States Patent
Oh et al.

(10) Patent No.: US 10,128,288 B2
(45) Date of Patent: Nov. 13, 2018

(54) IMAGE SENSORS AND IMAGE PROCESSING DEVICES INCLUDING THE SAME

(71) Applicant: Samsung Electronics Co., Ltd., Suwon-si, Gyeonggi-do (KR)

(72) Inventors: Young Sun Oh, Yongin-si (KR); Jung Chak Ahn, Yongin-si (KR); Young Woo Jung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 115 days.

(21) Appl. No.: 15/229,549

(22) Filed: Aug. 5, 2016

(65) Prior Publication Data

US 2017/0040364 A1 Feb. 9, 2017

(30) Foreign Application Priority Data

Aug. 7, 2015 (KR) .......................... 10-2015-0111356

(51) Int. Cl.
*H01L 27/146* (2006.01)

(52) U.S. Cl.
CPC .. *H01L 27/14614* (2013.01); *H01L 27/14605* (2013.01); *H01L 27/14612* (2013.01); *H01L 27/14636* (2013.01); *H01L 27/14643* (2013.01); *H01L 27/1464* (2013.01); *H01L 27/14621* (2013.01); *H01L 27/14627* (2013.01); *H01L 27/14689* (2013.01)

(58) Field of Classification Search
CPC ......... H01L 27/14614; H01L 27/14605; H01L 27/14612; H01L 27/14643; H01L 27/14636; H01L 27/1464; H01L 27/14689; H01L 27/14627; H01L 27/14621

See application file for complete search history.

(56) References Cited

U.S. PATENT DOCUMENTS

| | | | | |
|---|---|---|---|---|
| 2003/0227039 | A1* | 12/2003 | Umeda | ............. H01L 27/14643 257/291 |
| 2006/0084195 | A1 | 4/2006 | Lyu | |
| 2006/0284274 | A1 | 12/2006 | Lee et al. | |
| 2009/0303371 | A1 | 12/2009 | Watanabe et al. | |
| 2012/0175685 | A1* | 7/2012 | Kim | ................. H01L 27/14603 257/225 |

(Continued)

FOREIGN PATENT DOCUMENTS

| KR | 1020030089739 | 11/2003 |
|---|---|---|
| KR | 1020050011947 | 1/2005 |

(Continued)

*Primary Examiner* — Hung Lam
(74) *Attorney, Agent, or Firm* — Myers Bigel, P.A.

(57) ABSTRACT

Image sensors and image processing devices including the image sensors are provided. The image sensors may include a semiconductor substrate including a plurality of pixel areas, a photodiode provided in the semiconductor substrate in one of the plurality of pixel areas and a transfer transistor having a transfer gate electrode. A portion of the transfer gate electrode may be in the semiconductor substrate and may extend toward the photodiode. The image sensors may also include a floating diffusion configured to accumulate charges transferred from the photodiode by the transfer transistor, and the floating diffusion may include a first area and a second area disposed on different sides of the transfer gate electrode.

20 Claims, 16 Drawing Sheets

(56) References Cited

U.S. PATENT DOCUMENTS

2014/0370645 A1* 12/2014 Yamaguchi ....... H01L 27/14698
　　　　　　　　　　　　　　　　　　　　　438/72
2017/0207264 A1*  7/2017 Oh ................... H01L 27/14603

FOREIGN PATENT DOCUMENTS

| KR | 1020060059553 | 6/2006 |
| KR | 1020100079384 | 7/2010 |
| KR | 1020100080149 | 7/2010 |

* cited by examiner

IMAGE SENSORS AND IMAGE PROCESSING DEVICES INCLUDING THE SAME

CROSS-REFERENCE TO RELATED APPLICATION

This application claims priority under 35 U.S.C. § 119 to Korean Patent Application No. 10-2015-0111356, filed on Aug. 7, 2015, with the Korean Intellectual Property Office, the disclosure of which is hereby incorporated by reference in its entirety.

BACKGROUND

The present inventive concept relates to an image sensor and an image processing device including the same.

Semiconductor-based image sensors that receive light and generate electrical signals therefrom may include a pixel array including a plurality of pixels, a circuit driving the pixel array, and the like. Image sensors have been widely used in smart phones, tablet PCs, laptop PCs, televisions and the like in addition to dedicated cameras capturing images or video footage. In recent years, various techniques have been developed to improve a degree of integration of pixels of image sensors while broadly applying image sensors to portable devices.

To improve a degree of pixel integration, a technology of forming transfer gate electrodes respectively included in the pixels of image sensors using vertical structures has been introduced. However, when the vertical structures of such transfer gate electrodes are applied to the pixels of image sensors, charges generated by photodiodes may not be efficiently transferred to floating diffusions and may result in image lag.

SUMMARY

Some embodiments of the present inventive concept may provide an image sensor that may be able to reduce image lag by efficiently transferring a charge generated by a photodiode to a floating diffusion and an image processing device including the same.

An image sensor may include a semiconductor substrate including a plurality of pixel areas, a photodiode in the semiconductor substrate in one of the plurality of pixel areas and a transfer transistor including a transfer gate electrode. A portion of the transfer gate electrode may be in the semiconductor substrate and extending toward the photodiode. The image sensor may also include a floating diffusion configured to accumulate charges transferred from the photodiode. The floating diffusion may include a first area and a second area disposed on different sides of the transfer gate electrode.

According to various embodiments, the first and second areas may be separated from each other.

In various embodiments, the first and second areas may be electrically connected to each other.

In various embodiments, the first and second areas may be symmetrical with respect to the transfer gate electrode.

According to various embodiments, the first and second areas may have substantially the same size.

According to various embodiments, the first and second areas may be connected to each other and comprise a single area.

In various embodiments, the transfer gate electrode may extend through the floating diffusion.

According to various embodiments, the first and second areas may be connected to first and second contacts, respectively, and the first and second contacts may be electrically connected through a conductive line.

In various embodiments, the first and second contacts may be symmetrically disposed with respect to the transfer gate electrode.

According to various embodiments, the semiconductor substrate may include a first surface and a second surface opposite the first surface, and the transfer gate electrode and the floating diffusion may be adjacent to the first surface In various embodiments, a portion of the floating diffusion may be exposed by the first surface.

In various embodiments, the image sensor may further include a color filter on the second surface and a microlens on the color filter.

According to various embodiments, the image sensor may further a reset transistor configured to reset the floating diffusion in response to a reset control signal and a driving transistor configured to generate a pixel signal in response to a voltage of the floating diffusion.

According to various embodiments, the semiconductor substrate may include an isolation area separating the plurality of pixel areas from each other.

An image processing device may include an image sensor including a plurality of pixels. Each of the plurality of pixels may include a photodiode configured to generate charges in response to incident light, a transfer transistor including a transfer gate electrode extending toward the photodiode, a floating diffusion configured to accumulate charges transferred from the photodiode and a driving transistor configured to generate a pixel signal in response to a voltage of the floating diffusion. The floating diffusion may include a first area and a second area disposed on different sides of the transfer gate electrode. The image processing device may also include a processor configured to generate image data in response to the pixel signal.

An image sensor may include a pixel including a photodiode in a substrate. The photodiode may be spaced apart from a surface of the substrate. The image sensor may also include a first floating diffusion and a second floating diffusion adjacent the surface of the substrate and a transfer gate electrode extending from the first floating diffusion and the second floating diffusion to the photodiode. The first floating diffusion and the second floating diffusion may be on respective opposing sides of the transfer gate electrode when viewed in cross section.

In various embodiments, the first floating diffusion and the second floating diffusion may be spaced apart from each other.

According to various embodiments, the first floating diffusion and the second floating diffusion may be electrically connected to a conductive line.

According to various embodiments, each of the first floating diffusion and the second floating diffusion may include a portion of a floating diffusion having a unitary structure.

In various embodiments, the transfer gate electrode may extend through the floating diffusion.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
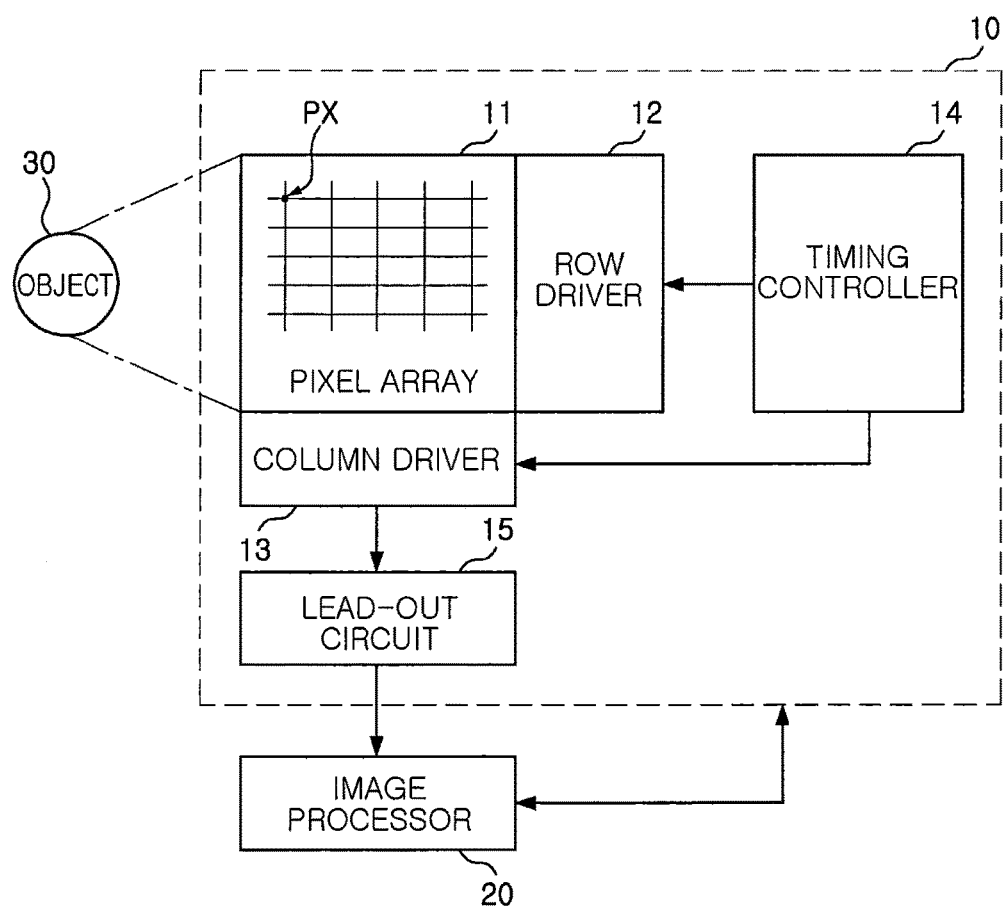
FIG. 1 is a block diagram of an image processing device according to some embodiments of the present inventive concept.

Hereinafter, some embodiments of the present inventive concept will be described with reference to the attached drawings.

The present inventive concept may, however, be exemplified in many different forms and should not be construed as being limited to the specific embodiments set forth herein. Rather, these embodiments are provided so that this disclosure will be thorough and complete and will fully convey the scope of the disclosure to those skilled in the art.

Throughout the specification, it will be understood that when an element, such as a layer, region or substrate, is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be understood that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the present inventive concept.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, steps, operations, members, elements, and/or groups thereof, but do not preclude the presence or addition of one or more other features, steps, operations, members, elements, and/or groups thereof.

Hereinafter, some embodiments of the present inventive concept will be described with reference to schematic views. In the drawings, for example, due to manufacturing techniques and/or tolerances, modifications of the shape shown may be expected. Thus, embodiments of the present inventive concept should not be construed as being limited to the particular shapes illustrated herein but may include deviations in shapes that results, for example, from manufacturing. The following embodiments may also be constituted by one or a combination thereof.

The contents of the present inventive concept described below may have a variety of configurations and propose only a required configuration herein, but are not limited thereto.

FIG. 1 is a block diagram of an image processing device according to some embodiments of the present inventive concept.

Referring to FIG. 1, an image processing device according to some embodiments of the present inventive concept may include an image sensor 10 and an image processor 20. The image sensor 10 may include a pixel array 11, a row driver 12, a column driver 13, a timing controller 14, a lead-out circuit 15, and the like.

The image sensor 10 may operate in response to a control command of the image processor 20, and may convert light transmitted from an object 30 into an electrical signal and may output the electrical signal to the image processor 20. The pixel array 11 included in the image sensor 10 may include a plurality of pixels PX, and each of the plurality of pixels PX may include a photoelectric device that receives light and generates charges therefrom, for example, a photodiode (PD). According to some embodiments of the present inventive concept, the pixel PX may include at least one circuit element generating an electrical signal from charges generated by the photodiode, for example, a transistor, in addition to the photodiode. According to some embodiments of the present inventive concept, each of the pixels PX may include a transfer transistor, a driving transistor, a select transistor, a reset transistor and the like in addition to a photodiode.

The row driver 12 may operate the pixel array 11 in row units. For example, the row driver 12 may generate a transmission control signal controlling the transfer transistor of each pixel PX, a reset control signal controlling the reset transistor of each pixel PX, a select control signal controlling the select transistor of each pixel PX, and the like.

The column driver 13 may include a correlated double sampler (CDS), an analog-to-digital converter (ADC), and the like. The CDS may receive a signal from pixels PX included in a row selected by a row selection signal provided by the row driver 12 to perform correlated double sampling. The ADC may convert output of the CDS into a digital signal and may transmit the digital signal to the lead-out circuit 15.

The lead-out circuit 15 may include a latch or a buffer circuit that may temporarily store a digital signal, an amplifier circuit, and the like, and may temporarily store or amplify a digital signal received from the column driver 13 to generate image data. Operation timings of the row driver 12, the column driver 13, and the lead-out circuit 15 may be determined by the timing controller 14, and the timing controller 14 may operate in response to a control command transmitted by the image processor 20. The image processor 20 may perform signal processing of image data transmitted by the lead-out circuit 15, may output the processed image data to a display device or the like, or may store the processed image data in a storage device, such as a memory.

Figure 2A:
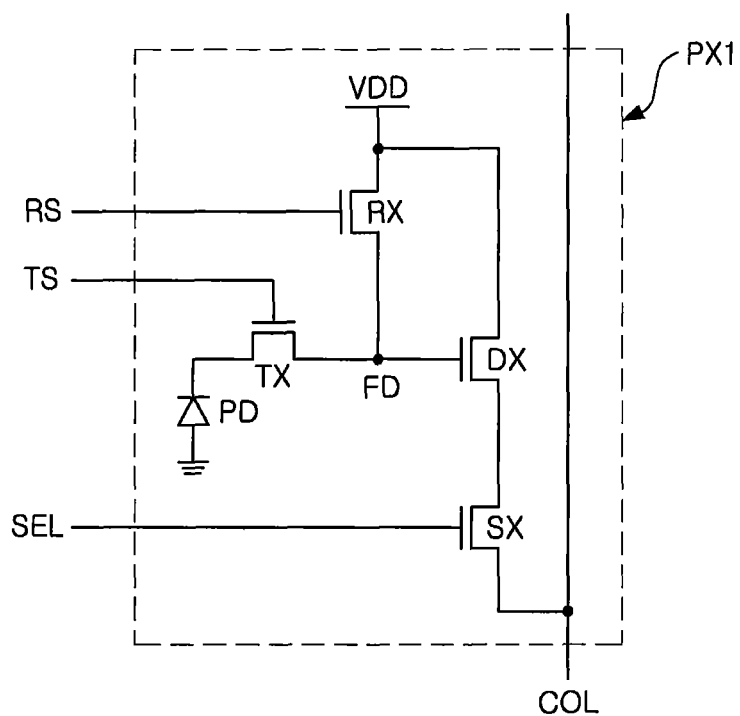
FIGS. 2A, 2B and 2C are circuit diagrams respectively illustrating pixels included in an image sensor according to some embodiments of the present inventive concept.
Figure 2B:
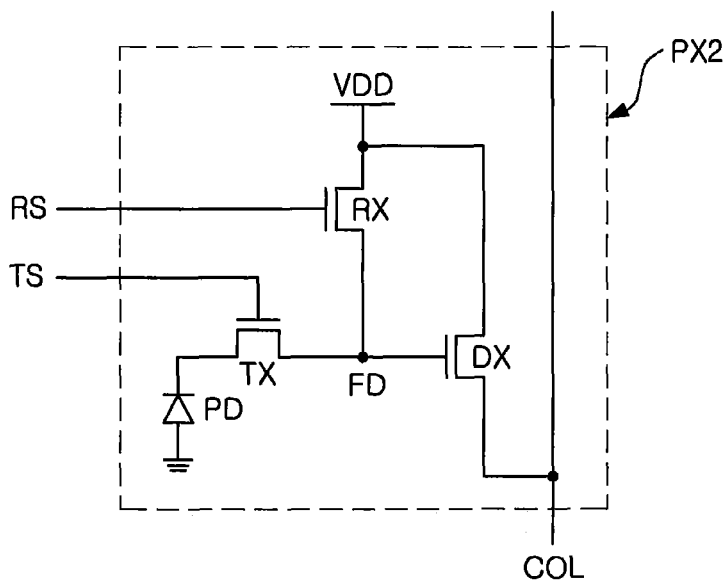
Figure 2C:
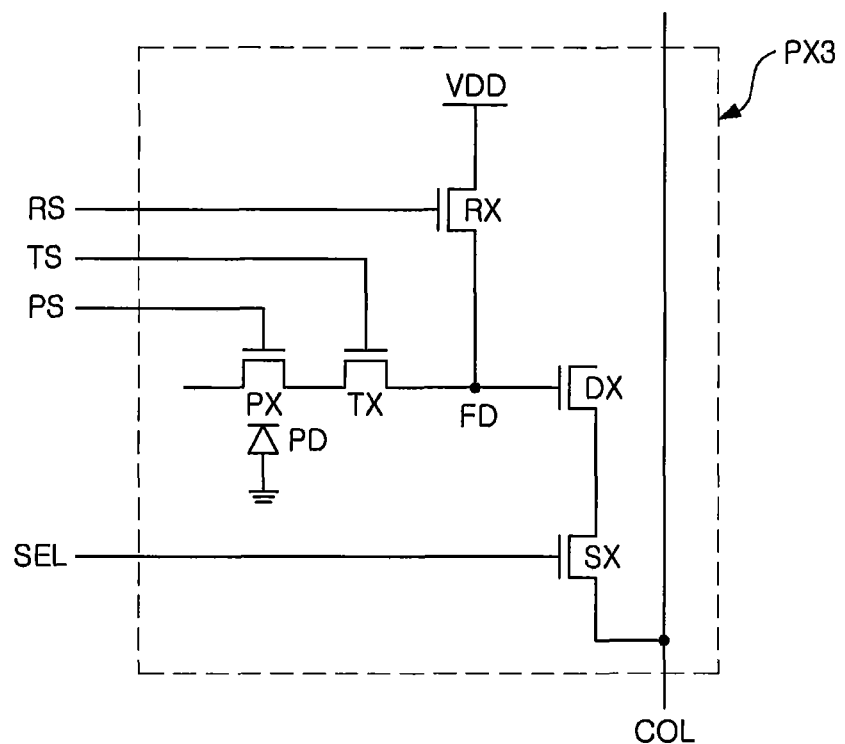

FIGS. 2A, 2B and 2C are circuit diagrams respectively illustrating pixels included in an image sensor according to some embodiments of the present inventive concept.

Referring first to FIG. 2A, a pixel PX1 included in an image sensor according to some embodiments of the present inventive concept may include a plurality of transistors RX, DX, SX, and TX and a photodiode PD. The plurality of transistors may include a reset transistor RX, a driving transistor DX, a transfer transistor TX and a select transistor SX.

The photodiode PD may generate charges in response to incident light on the pixel PX1 as a photoelectric device. Charges generated by the photodiode PD may be transmitted to the floating diffusion FD by the transfer transistor TX and may be accumulated in the floating diffusion FD. The transfer transistor TX may operate in response to a transfer control signal TS transmitted to a gate electrode of the transfer transistor TX.

The driving transistor DX may operate as a source follower buffer amplifier by charges accumulated in the floating diffusion FD. The driving transistor DX may amplify charges accumulated in the floating diffusion FD and transmit the amplified charges to the select transistor SX.

In addition, the select transistor SX may operate in response to a select control signal SEL selecting the pixel PX1 and perform switching and addressing operations. When a select control signal SEL is applied by the row driver 12, the select transistor SX may output a pixel signal to a column line COL connected to the pixel PX1.

The reset transistor RX may operate in response to a reset control signal RS transmitted from the row driver 12. When a reset control signal RS is received, the reset transistor RX may reset a voltage of the floating diffusion FD to VDD.

FIG. 2B is a circuit diagram illustrating a pixel PX2 according to some embodiments of the present inventive concept. Referring to FIG. 2B, the pixel PX2 included in an image sensor according to some embodiments of the present inventive concept may include three transistors RX, DX, and TX and a photodiode PD. For example, the pixel PX2 illustrated in FIG. 2B may only include three transistors RX, DX, and TX, unlike the pixel PX1 illustrated in FIG. 2A.

According to some embodiments illustrated in FIG. 2B, the reset transistor RX may perform a function similar to that of the select transistor SX illustrated in FIG. 2A by resetting a voltage of the floating diffusion FD to VDD or setting the voltage to a voltage of a low level, for example, 0V.

FIG. 2C is a circuit diagram illustrating a pixel PX3 according to some embodiments of the present inventive concept. Referring to FIG. 2C, the pixel PX3 included in an image sensor according to some embodiments of the present inventive concept may include five transistors RX, DX, TX, SX, and PX and a photodiode PD.

Hereinafter, a structure of each of pixels included in an image sensor according to some embodiments of the present inventive concept will be described with reference to FIGS. 3 through 8. Pixels 100, 200, and 300 according to some embodiments of the present inventive concept illustrated in FIGS. 3 through 8 may be disposed in the form of an m×n matrix (where m and n are integers of two or more, respectively) in the pixel array 11.

Figure 3:
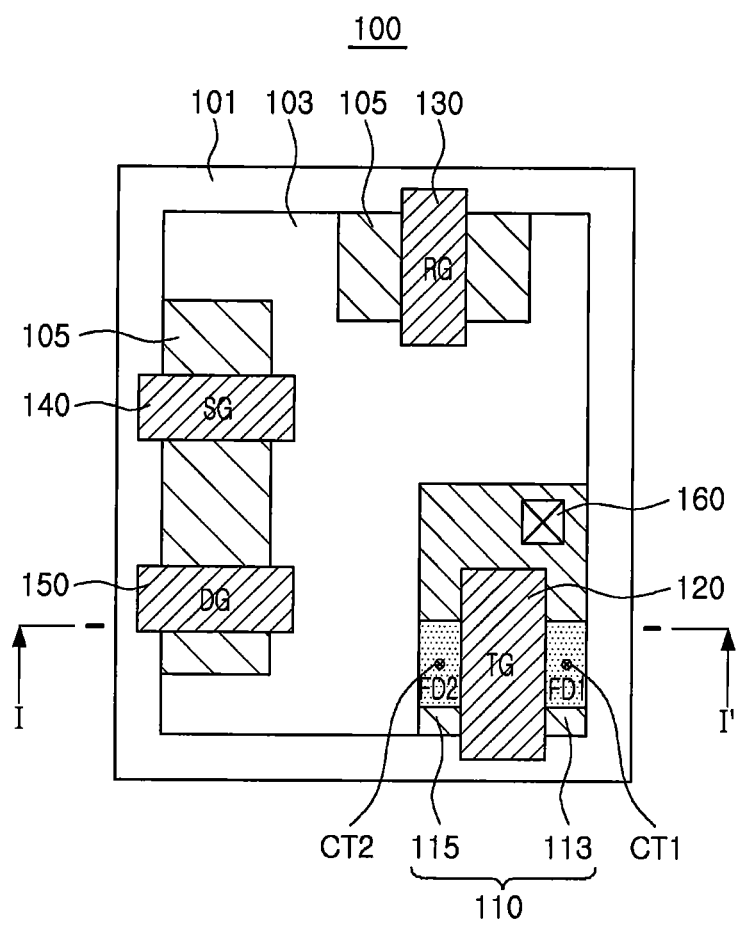
FIG. 3 is a layout of a pixel included in an image sensor according to some embodiments of the present inventive concept.

FIG. 3 is a layout of a pixel included in an image sensor according to some embodiments of the present inventive concept.

Referring to FIG. 3, the pixel 100 according to some embodiments of the present inventive concept may include an isolation area 101. The isolation area 101 may be formed using, for example, a deep trench isolation (DTI) process to reduce electrical or optical crosstalk between adjacent pixels. The isolation area 101 may include oxide or the like, and side walls of the isolation area 101 may include a highly reflective material, for example, a polysilicon incorporating boron, or the like.

The isolation area 101 may surround a device isolation film 103, an impurity area 105, a floating diffusion 110, a transfer gate electrode TG 120 included in a transfer transistor TX, a reset gate electrode RG 130 included in a reset transistor RX, a select gate electrode SG 140 included in a select transistor SX, a driving gate electrode DG 150 included in a driving transistor DX, a ground area 160, and the like. The device isolation film 103 may be formed using, for example, a shallow trench isolation (STI) process to electrically separate at least a portion of the respective transistors TX, RX, SX, and DX included in the pixel 100, and may have a relatively shallow depth as compared to the isolation area 101.

Figure 4:
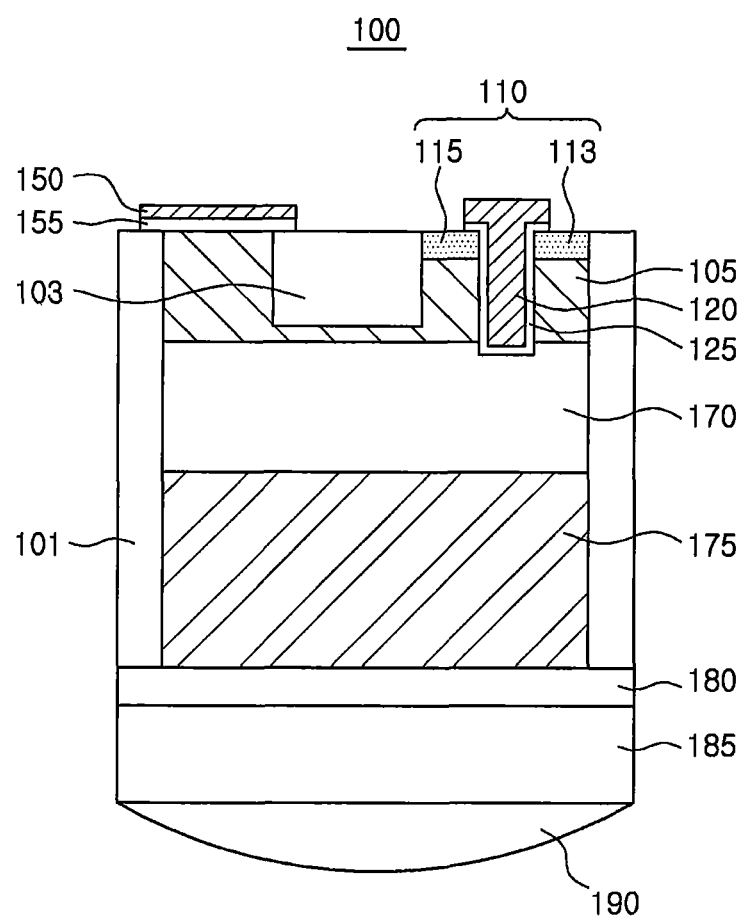
FIG. 4 is a cross-sectional view taken along the line I-I' of FIG. 3.

The transfer gate electrode 120 may have a vertical gate structure extending in a depth direction from a first surface defined as an upper surface of the pixel 100. For example, the transfer gate electrode 120 may extend in a depth direction from the upper surface of the pixel 100, and may be adjacent to a photodiode disposed below the plurality of gate electrodes 130, 140, and 150, the device isolation film 103, and the floating diffusion 110. The pixel 100 according to some embodiments of the present inventive concept may include the transfer gate electrode 120 extending in a depth direction from the upper surface of the pixel 100, and may include a photodiode, a color filter, a microlens, and the like sequentially provided below the transfer gate electrode 120. Thus, shortening a distance from the microlens to the photodiode and eliminating a wire or the like therebetween may increase light receiving efficiency, light sensitivity, and the like. An arrangement of the transfer gate electrode 120, the photodiode, the color filter, and the microlens will be described below with reference to FIG. 4 illustrating a cross section taken along the line I-I' of FIG. 3.

As described above with reference to FIGS. 2A through 2C, charges generated from light received by the photodiode may be transmitted to the floating diffusion FD 110 through the transfer transistor TX. According to some embodiments of the present inventive concept illustrated in FIG. 3, the floating diffusion 110 may include a first area FD1 113 and a second area FD2 115 defined in different positions based on the transfer gate electrode 120. The first area FD1 113 and the second area FD2 115 may be on different sides of the transfer gate electrode 120 as illustrated in FIG. 3. Thus, when an electrical signal is applied to the transfer gate electrode 120 to form a charge transfer path, charges may be transferred to the first and second areas 113 and 115.

As appreciated by the present inventors, when the floating diffusion 110 is formed only on one side of the transfer gate electrode 120, a transfer path of charges generated by the photodiode may include a path detouring to a side of the transfer gate electrode 120, on which the floating diffusion 110 is not formed, as well as a shortest path from the photodiode to the floating diffusion 110. Consequently, variations in the charge transfer paths may occur and deteriorations in charge transfer efficiency may result in incomplete transfer of charges generated by the photodiode in a previous frame to the floating diffusion 110 before a subsequent frame. Accordingly, portions of charges generated by the photodiode in a previous frame may remain in the photodiode and may result in image lag.

According to some embodiments of the present inventive concept, the floating diffusion 110 may include the first and second areas 113 and 115 located in different directions, respectively, based on the transfer gate electrode 120 rather than being formed on a side of the transfer gate electrode 120. Thus, a length of a charge transfer path may be shortened as well as variations in charge transfer paths may be reduced, thereby increasing charge transfer efficiency. According to some embodiments of the present inventive concept, image lag may be reduced or possibly prevented. Charges generated in a previous frame may affect a subsequent frame if those charges are not completely transferred to the floating diffusion 110 before the subsequent frame.

The first and second areas 113 and 115 included in the floating diffusion 110 may be connected to different contacts, respectively. For example, the first area 113 may be connected to a first contact CT1, the second area 115 may be connected to a second contact CT2, and the first and second contacts CT1 and CT2 may be electrically connected to each other by a conductive line. Thus, the first and second areas 113 and 115 included in the floating diffusion 110 may be physically separated from each other and may provide a node on an equivalent circuit as illustrated in FIGS. 2A through 2C.

According to some embodiments of the present inventive concept illustrated in FIG. 3, the first and second areas 113 and 115 included in the floating diffusion 110 may have substantially the same area and shape. The first and second areas 113 and 115 may also be symmetrical with respect to the transfer gate electrode 120 such that transfer paths of charges generated by the photodiode (PD) may not to be biased on a side of the transfer gate electrode 120 and charge transfer efficiency may increase. Shapes and positions of the first and second areas 113 and 115 may be modified to increase charge transfer efficiency. For example, if necessary, the first and second areas 113 and 115 may be disposed to have different shapes and areas, or to be asymmetrical to each other with respect to the transfer gate electrode 120.

The reset gate electrode 130, the select gate electrode 140, and the driving gate electrode 150 may be formed on the impurity area 105. The impurity area 105 may include p-type impurities and may be provided as a p-WELL area for the plurality of transistors TX, DX, RX, and SX. A portion of the impurity area 105 may be injected with n-type impurities to be provided as a drain region and a source region of each of the transistors DX, SX, and RX. A portion of the impurity area 105 provided as a drain region and a source region may be doped with n+ impurities.

The ground area 160 may supply a ground voltage necessary for operations of the pixel 100 and may be connected to a side of the photodiode (PD) to supply a ground voltage as illustrated in FIGS. 2A through 2C.

Hereinafter, a cross-sectional view of the pixel 100 illustrated in FIG. 3 will be discussed with reference to FIG. 4.

FIG. 4 is a cross-sectional view taken along the line I-I' of FIG. 3.

Referring to FIG. 4, a microlens 190, a color filter 185, an antireflection layer 180, and the like may be sequentially stacked in a lower portion of the pixel 100. Light incident from the outside may be focused by the microlens 190 and then transferred to the photodiode 170 through the color filter 185 and the antireflection layer 180. The photodiode 170 may be included in a semiconductor substrate and provided in an epitaxial layer 175 including p-type impurities.

The epitaxial layer 175 may be provided as the semiconductor substrate along with a silicon substrate, and the silicon substrate may be removed during a process of manufacturing the pixel 100. The epitaxial layer 175 may be formed by performing a process using, for example, a silicon source gas (e.g., silane, dichlorosilane (DCS), trichlorosilane (TCS), hexachlorosilane (HCS), or a combination thereof) on an upper surface of the silicon substrate. The epitaxial layer 175 may be grown as substantially the same crystal structure as that of the silicon substrate, and the photodiode 170 may be formed by injecting n-type impurities into the epitaxial layer 175 using an ion injection process.

In addition, the epitaxial layer 175 may include an isolation area 101 formed therein to isolate the pixel 100 from other pixels. As described above, the isolation area 101 may include oxide to reduce or possibly prevent optical or electrical crosstalk between pixels and may be formed using, for example, a DTI process. The side walls of the isolation area 101 may be covered with a highly reflective material.

The photodiode 170 may include the impurity area 105, the device isolation film 103, the floating diffusion 110, the transfer gate electrode 120, and the driving gate electrode 150, formed thereon. The impurity area 105 may be formed by injecting the p-type impurities into an upper portion of the photodiode 170 using the ion injection process and may be provided as the p-WELL area for the plurality of transistors TX, DX, RX, and SX. The device isolation film 103 may be formed using, for example, an STI process or the like to isolate the plurality of transistors TX, DX, RX, and SX from each other, and the floating diffusion 110 may be an area doped with n+ impurities using the ion injection process.

As illustrated in FIGS. 3 and 4, the transfer gate electrode 120 may have a portion embedded in the epitaxial layer 175 of the semiconductor substrate and extending toward the photodiode 170. For example, the transfer gate electrode 120 according to some embodiments of the present inventive concept may be a vertical transfer gate extending in a direction perpendicular to the photodiode 170 as illustrated in FIG. 4. Other gate electrodes in addition to the transfer gate electrode 120, for example, the driving gate electrode 150 illustrated in the FIG. 4 may be formed above the epitaxial layer 175 and may not include a portion embedded in the epitaxial layer 175. First and second gate insulating layers 125 and 155 may be provided on lower portions of the transfer gate electrode 120 and the driving gate electrode 150, respectively. The gate insulating layers 125 and 155 may include, for example, a silicon oxide ($SiO_x$), a silicon oxynitride ($SiO_xN_y$), a silicon nitride ($SiN_x$), a germanium oxynitride ($GeO_xN_y$), a germanium silicon oxide ($GeSi_xO_y$) and/or a material having a high dielectric constant. The material having a high dielectric constant may include a hafnium oxide ($HfO_x$), a zirconium oxide ($ZrO_x$), an aluminum oxide ($AlO_x$), a tantalum oxide ($TaO_x$), a hafnium silicate ($HfSi_x$) and/or a zirconium silicate ($ZrSi_x$).

According to some embodiments of the present inventive concept, the floating diffusion 110 may include the first and second areas 113 and 115. The first and second areas 113 and 115 may be disposed in different positions based on the transfer gate electrode 120. In some embodiments, the first and second areas 113 and 115 may be disposed on different sides of the transfer gate electrode 120 as illustrated in FIG. 3. In some embodiments, the first and second areas 113 and 115 may be disposed on respective opposing sides of the transfer gate electrode 120 when viewed in cross section as illustrated in FIG. 4. The first and second areas 113 and 115 may be physically separated from each other and may have substantially the same shape and dimensions. Disposing the first and second areas 113 and 115 of the floating diffusion 110 in the different positions based on the transfer gate electrode 120 may allow charges generated by the photodiode 170 to be transferred to each of the first and second areas 113 and 115. Thus, charges generated by the photodiode 170 may be transferred to the floating diffusion 110 through charge transfer paths from the photodiode 170 to each of the first and second areas 113 and 115 and the charge transfer paths may be shortened. Accordingly, distribution of the charge transfer paths may be reduced, charge transfer efficiency may increase and image lag may be reduced or possibly prevented.

Figure 5:
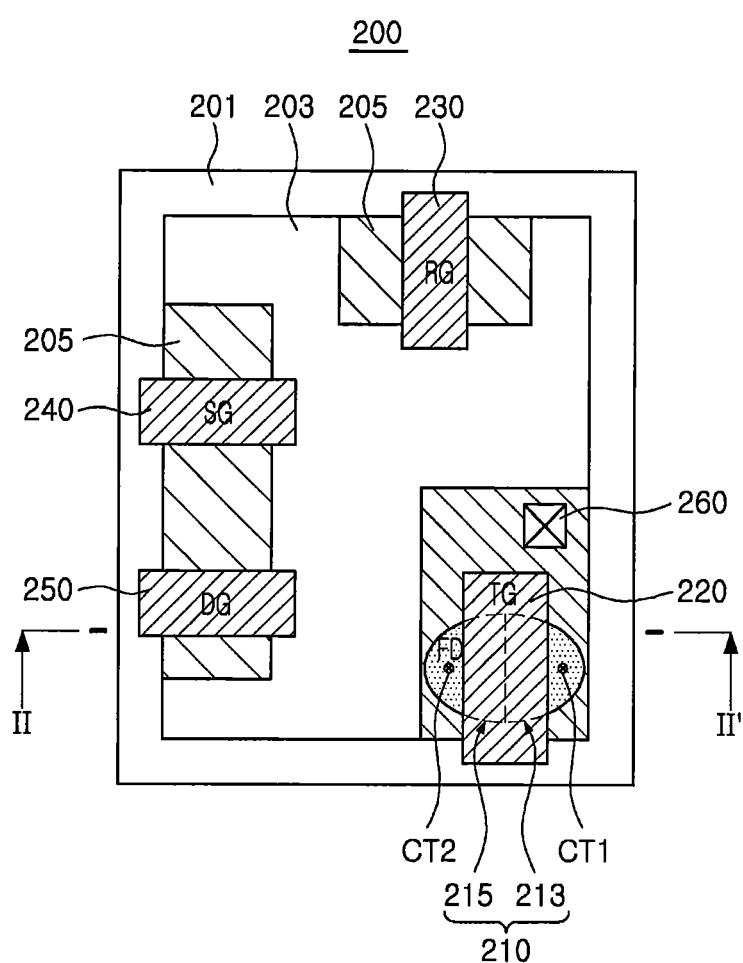
FIG. 5 is a layout of a pixel included in an image sensor according to some embodiments of the present inventive concept.

FIG. 5 is a layout of pixels included in an image sensor according to some embodiments of the present inventive concept.

Referring to FIG. 5, a pixel 200 according to some embodiments of the present inventive concept may include an isolation area 201 formed using, for example, a DTI process to reduce or possibly prevent electrical or optical crosstalk between adjacent pixels. In addition, the pixel 200 separated by the isolation area 201 may include a plurality of gate electrodes 220, 230, 240 and 250, an impurity area 205, a device isolation film 203, a floating diffusion 210, a ground area 260, and the like.

The impurity area 205 may include p-type impurities and may be provided as a p-WELL area for the plurality of transistors TX, DX, RX, and SX. In addition, at least a portion of the impurity area 205 may be doped with n+ impurities to be provided as a drain region and a source region of each of the transistors TX, DX, RX, and SX. The device isolation film 203 may isolate the plurality of transistors TX, DX, RX, and SX included in the pixel 200 from each other, may be formed using, for example, an STI process and may have a depth lower than that of the isolation area 201.

The plurality of gate electrodes 220, 230, 240, and 250 may be provided on the impurity area 205 provided as the p-WELL area. According to some embodiments of the present inventive concept illustrated in FIG. 5, the transfer gate electrode 220 may have at least a portion embedded in a semiconductor substrate and extending in a direction perpendicular to a photodiode PD. For example, the transfer gate electrode 220 may have a portion extending perpendicular to an upper surface of the semiconductor substrate.

The floating diffusion 210 may include a first area 213 and a second area 215 disposed in different directions based on the transfer gate electrode 220. In some embodiments, the first area 213 and the second area 215 may be on different sides of the transfer gate electrode 220. According to some embodiments of the present inventive concept illustrated in FIG. 5, the first and second areas 213 and 215 included in the floating diffusion 210 may be physically connected to each other to provide a single area. The floating diffusion 210 including the first and second areas 213 and 215 may have a unitary structure. Since the first and second areas 213 and 215 provide the single area, the transfer gate electrode 220 may extend through the floating diffusion 210.

According to some embodiments of FIG. 5, the first and second areas 213 and 215 may be connected to different first and second contacts CT1 and CT2, respectively. For example, the first area 213 may be connected to the first contact CT1, and the second area 215 may be connected to the second contact CT2. The first and second contacts CT1 and CT2 may be connected to each other by a conductive line.

The photodiode may be located below the transfer gate electrode 220 and the floating diffusion 210, and charges generated by the photodiode may be transferred to the floating diffusion 210 by a voltage applied to the transfer gate electrode 220. According to some embodiments of the present inventive concept illustrated in FIG. 5, the floating diffusion 210 may include the first area 213 and the second area 215 respectively located on respective opposing sides of the transfer gate electrode 220. Evenly transferring charges generated by the photodiode to the first and second areas 213 and 215, rather than by a detour path, may be advantageous in terms of charge transfer efficiency. Thus, charge transfer efficiency may be increased by connecting the first and second contacts CT1 and CT2 to the first and second areas 213 and 215, respectively, and connecting the first and second contacts CT1 and C 2 to other transistors RX, DX, and SX based on the layouts respectively illustrated in FIGS. 2A through 2C.

Figure 6:
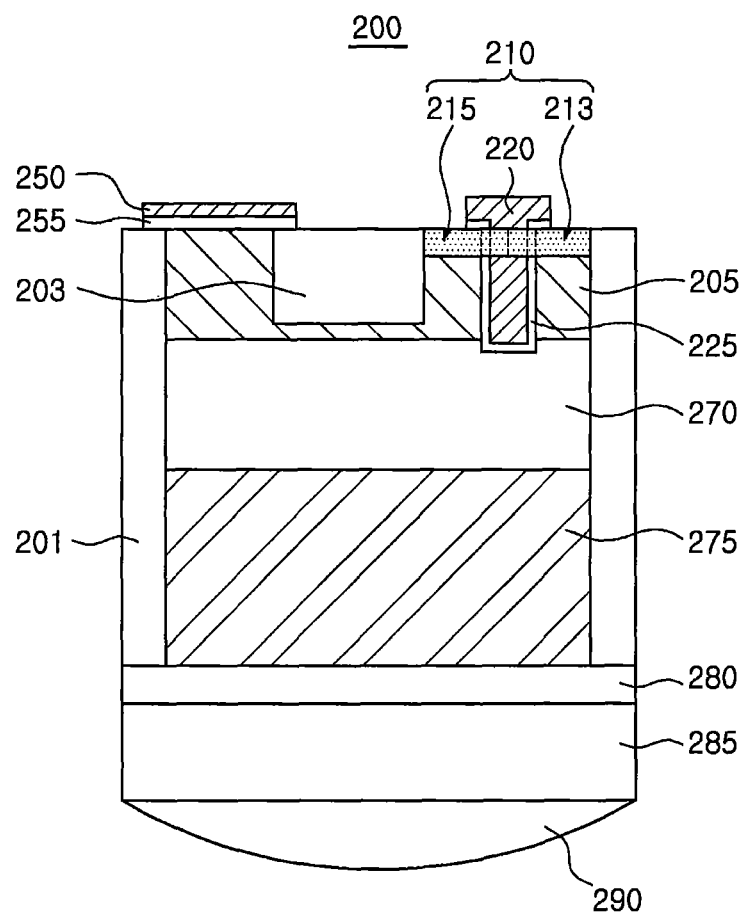
FIG. 6 is a cross-sectional view taken along the line II-II' of FIG. 5.

FIG. 6 is a cross-sectional view taken along the line II-II' of FIG. 5.

Referring to FIG. 6, a microlens 290, a color filter 285, an antireflection layer 280, and the like may be provided in a lower portion of the pixel 200. Light transmitted from the outside may be incident on a photodiode 270 through the color filter 285, the antireflection layer 280, and an epitaxial layer 275. The photodiode 270 may generate charges in response to incident light. The antireflection layer 280 may reduce or possibly prevent reflection of light incident from the outside on a lower surface of the epitaxial layer 275 and may be formed by stacking materials having different indices of refraction.

The epitaxial layer 275 may be provided as a portion of a semiconductor substrate on which the plurality of transistors TX, DX, RX, and SX, the floating diffusion 210, and the like may be formed and may be a p-type semiconductor layer formed on a silicon substrate. The photodiode 270 may be formed by injecting n-type impurities into the epitaxial layer 275, and the isolation area 201 for reducing or possibly preventing crosstalk between the plurality of pixels 200 may be formed using, for example, a DTI process. Side walls of the isolation area 201 may include a highly reflective material. The device isolation film 203 may be formed using, for example, an STI process as an area for isolating the plurality of transistors TX, DX, RX, and SX from each other and may have a depth less than that of the isolation area 201.

The transfer gate electrode 220 may have at least a portion embedded in the semiconductor substrate and extending toward the photodiode PD 270. When a voltage having a predetermined level is applied to the transfer gate electrode 220, a charge transfer path may be generated in the transfer gate electrode 220, and charges generated by the photodiode 270 may be accumulated in the floating diffusion 210 through the charge transfer path. According to some embodiments of the present inventive concept illustrated in FIG. 5, the floating diffusion 210 may include the first area 213 disposed on a right side and the second area 215 disposed on a left side of the transfer gate electrode 220, and the first and second areas 213 and 215 may be physically connected to each other to be provided as a single area. Thus, the transfer gate electrode 220 may extend through the floating diffusion 210. Since the transfer gate electrode 220 extends through the floating diffusion 210, the floating diffusion 210 may be formed before the transfer gate electrode 220 is formed.

The gate electrode 250 may have a planar structure formed on the upper surface of the semiconductor substrate. A first gate insulating layer 225 and a second gate insulating layer 255 may be provided between the transfer gate electrode 220 and the semiconductor substrate, and between the driving gate electrode 250 and the semiconductor substrate, respectively. The first and second gate insulating layers 225 and 255 may include, for example, a silicon oxide ($SiO_x$), a silicon oxynitride ($SiO_xN_y$), a silicon nitride ($SiN_x$), a germanium oxynitride ($GeO_xN_y$), a germanium silicon oxide ($GeSi_xO_y$) and/or a material having a high dielectric constant. The material having a high dielectric constant may include, for example, a hafnium oxide ($HfO_x$), a zirconium oxide ($ZrO_x$), an aluminum oxide ($AlO_x$), a tantalum oxide ($TaO_x$), a hafnium silicate ($HfSi_x$) and/or a zirconium silicate ($ZrSi_x$).

Figure 7:
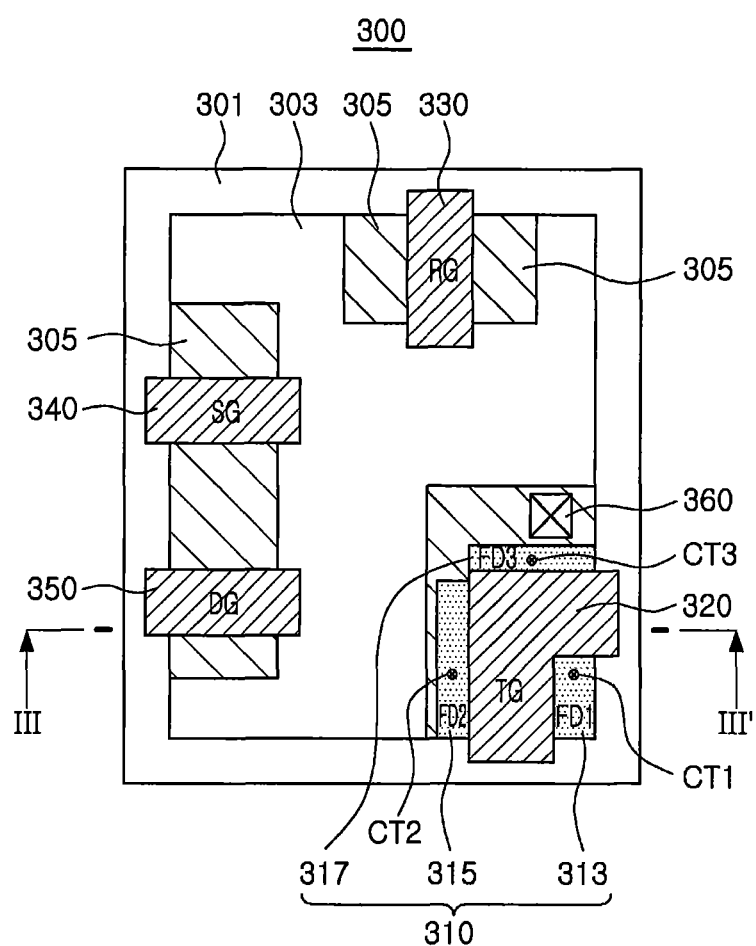
FIG. 7 is a layout of a pixel included in an image sensor according to some embodiments of the present inventive concept.

FIG. 7 is a layout of a pixel included in an image sensor according to some embodiments of the present inventive concept.

Referring to FIG. 7, a pixel 300 included in an image sensor according to some embodiments of the present inventive concept may be isolated from adjacent pixels by an isolation area 301 formed using, for example, a DTI process. The isolation area 301 may reduce or possibly prevent electrical or optical crosstalk between adjacent pixels. The pixel 300 may also include a device isolation film 303 formed using, for example, an STI process, an impurity area 305 provided as a p-WELL area of a plurality of transistors TX, DX, RX, and SX, a floating diffusion 310, and gate electrodes 320, 330, 340, and 350 respectively corresponding to the plurality of transistors TX, DX, RX, and SX. The pixel 3000 may include a ground area 360.

According to some embodiments of the present inventive concept illustrated in FIG. 7, the floating diffusion 310 may include first, second and third areas 313, 315, and 317. Portions of the first to third areas 313, 315, and 317 may be physically separated from or connected to each other. For example, all of the first to third areas 313, 315, and 317 may be physically separated from each other to exist independently of each other, or portions of the first to third areas 313, 315, and 317 may be physically connected to each other. Disposing the first to third areas 313, 315, and 317 in different positions based on the transfer gate electrode 320 may reduce variations in charge transfer paths through which charges generated by a photodiode may be transferred to the floating diffusion 310, thereby increasing charge transfer efficiency. In some embodiments, the first to third areas 313, 315, and 317 may be disposed in different sides of the transfer gate electrode 320 as illustrated in FIG. 7. The dimensions and shapes of the first to third areas 313, 315, and 317 may be substantially equal or different from each other.

The first to third areas 313, 315, and 317 included in the floating diffusion 310 may be connected to first to third contacts CT1, CT2, and CT3, respectively. The first to third contacts CT1, CT2, and CT3 may be electrically connected to each other by a conductive line, and thus the first to third areas 313, 315, and 317 may be electrically connected to each other such that the floating diffusion 310 may provide a node on an equivalent circuit as illustrated in FIGS. 2A through 2C.

Figure 8:
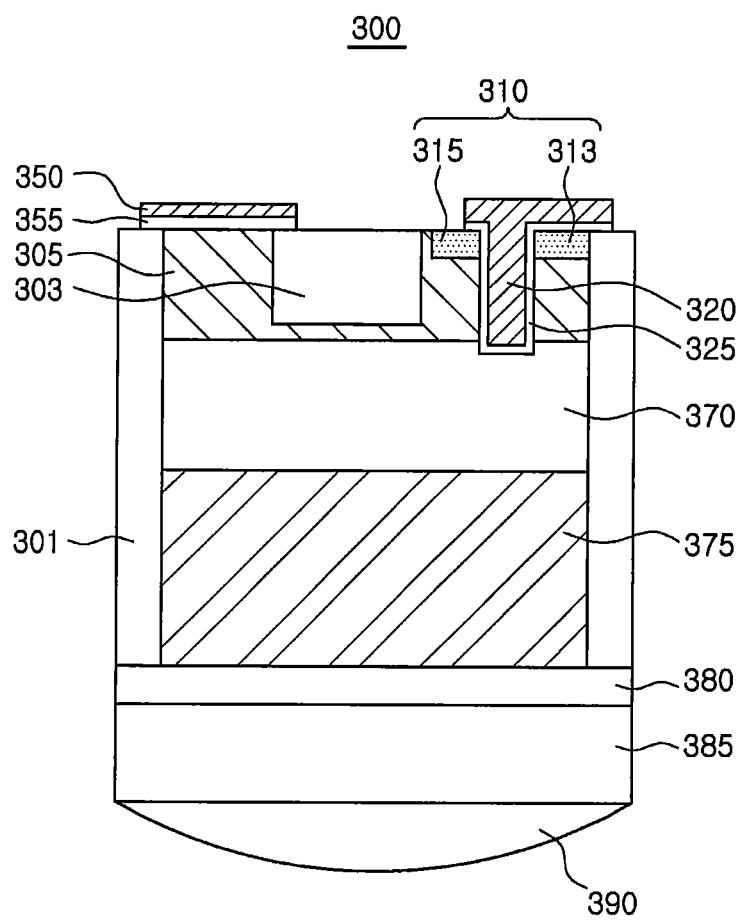
FIG. 8 is a cross-sectional view taken along the line III-III' of FIG. 7.

FIG. 8 is a cross-sectional view taken along the line III-III' of FIG. 7.

Referring to FIG. 8, the pixel 300 according to some embodiments of the present inventive concept may have a cross-sectional structure similar to that of the pixels 100 and 200 illustrated in FIGS. 4 and 6. For example, a microlens 390, a color filter 385, and an antireflection layer 380 may be sequentially provided from a lower portion of the pixel 300, and a photodiode PD 370 may be formed by injecting n-type impurities into an epitaxial layer 375 included in a semiconductor substrate. The photodiode 370 may include the impurity area 305 provided as the p-WELL area, the plurality of transistors TX, RX, DX, and SX, the device isolation film 303, the floating diffusion 310, and the like, disposed thereon. The isolation area 301 may be formed at a boundary between the pixel 300 and adjacent pixels using, for example, a DTI process.

Although a cross-section view taken along the line III-III' of FIG. 7 illustrated in FIG. 8 only shows the first and second areas 313 and 315 of the floating diffusion 310, but the floating diffusion 310 may further include the third area 317 in addition to the first and second areas 313 and 315. The first to third areas 313, 315, and 317 may be electrically connected to each other, and the floating diffusion 310 may be provided as a node. Disposing the floating diffusion 310 in different positions based on the transfer gate electrode 320 may reduce variations in the charge transfer paths and increase charge transfer efficiency when charges that the photodiode 370 generates by receiving light are transferred to the floating diffusion 310.

FIGS. 9 through 14 are cross-sectional views illustrating a method of manufacturing an image sensor according to some embodiments of the present inventive concept. The method illustrated in FIGS. 9 through 14 may be a method of manufacturing the pixel 100 according to some embodiments of the present inventive concept illustrated in FIGS. 3 and 4.

Figure 9:
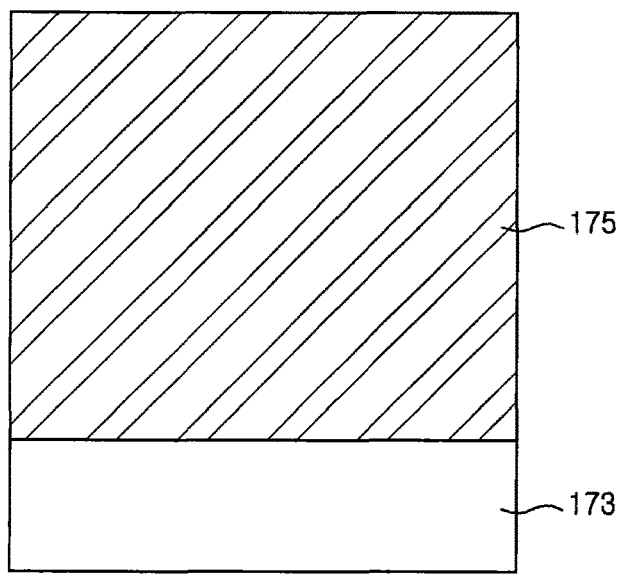
FIGS. 9 through 14 are cross-sectional views illustrating a method of manufacturing an image sensor according to some embodiments of the present inventive concept.

Referring first to FIG. 9, the method of manufacturing an image sensor according to some embodiments of the present inventive concept may include preparing a semiconductor substrate. The semiconductor substrate may include a silicon substrate 173, and an epitaxial layer 175 disposed on an upper surface of the silicon substrate 173. As described above, the epitaxial layer 175 may have a crystal structure similar to that of the silicon substrate 173 and may be formed by a process using, for example, a silicon source gas (e.g., silane, dichlorosilane (DCS), trichlorosilane (TCS), hexachlorosilane (HCS), or a combination thereof.)

Figure 10:
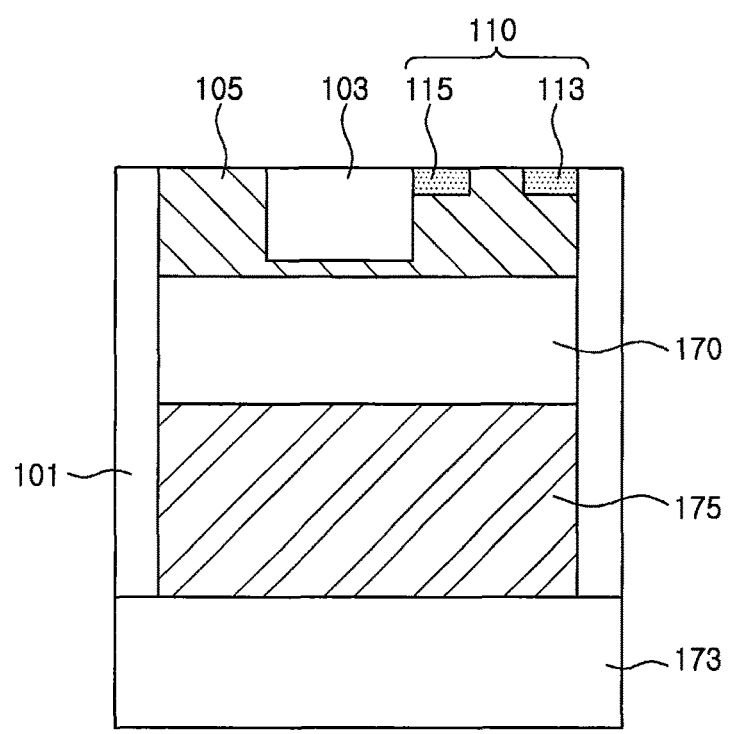

Referring now to FIG. 10, the epitaxial layer 175 of the semiconductor substrate may include the isolation area 101 for isolating the pixel 100 from adjacent pixels, the photodiode 170, the device isolation film 103, the impurity area 105, the floating diffusion 110, and the like, formed therein. The isolation area 101 may be formed using, for example, a DTI process. The isolation area 101 may include oxide and include a material having a refractive index lower than that of the semiconductor substrate.

The photodiode 170 may be formed by injecting n-type impurities into the epitaxial layer 175 using, for example, an ion injection process. According to some embodiments of the present inventive concept, the photodiode 170 may have a plurality of layers stacked on each other and having different impurity concentrations. When the photodiode 170 is formed, the impurity area 105 may be formed by injecting p-type impurities into a portion of the epitaxial layer 175 located on the photodiode 170. The impurity area 105 may include p-type impurities and may be provided as a p-WELL area for the plurality of transistors TX, DX, RX, and SX included in the pixel 100. The impurity area 105 may include the device isolation film 103 formed therein to isolate the plurality of transistors TX, DX, RX, and SX from each other. The device isolation film 103 may have a depth less than that of the isolation area 101 and may be formed using, for example, an STI process.

The floating diffusion 110 may be formed by injecting n-type impurities into at least a portion of the impurity area 105. The floating diffusion 110 may be an area in which charges generated by the photodiode 170 may be accumulated and may include a plurality of areas. According to some embodiments of the present inventive concept illustrated in FIG. 10, the floating diffusion 110 may include the first and second areas 113 and 115 separated from each other, and the first and second areas 113 and 115 may have substantially the same depth.

Figure 11:
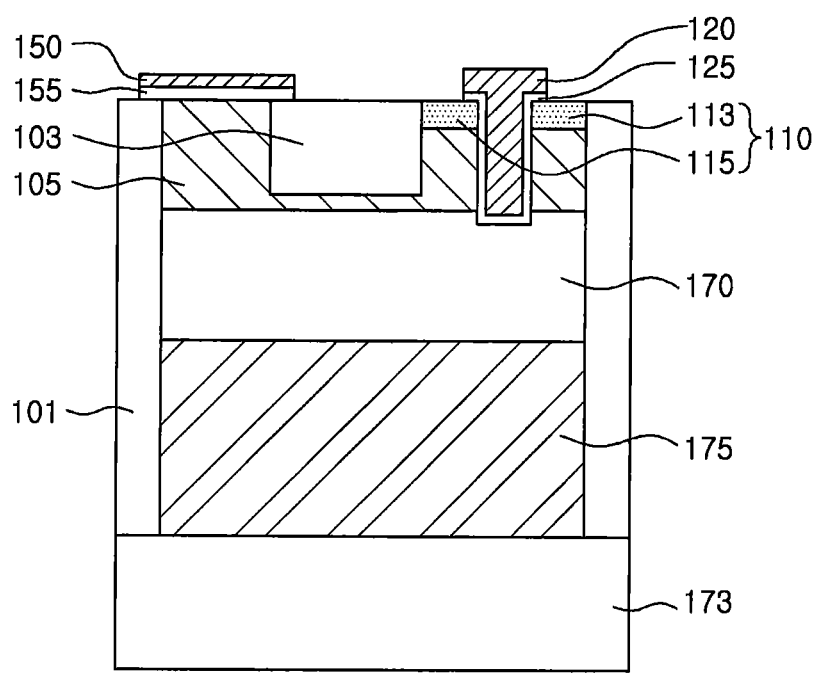

Referring now to FIG. 11, the gate electrodes (e.g., 120 and 150) of the plurality of transistors TX, DX, RX, and SX may be formed. Prior to forming the gate electrodes 120 and 150, the first and second gate insulating layers 125 and 155 may be formed, and the first and second gate insulating layers 125 and 155 may include a silicon oxide ($SiO_x$), a silicon oxynitride ($SiO_xN_y$), a silicon nitride ($SiN_x$), a germanium oxynitride ($GeO_xN_y$), a germanium silicon oxide ($GeSi_xO_y$) and/or a material having a high dielectric constant.

The gate electrodes 120 and 150 may include, for example, a polysilicon, a metal, and/or a metal compound. Referring to FIG. 11, the transfer gate electrode 120 may have a vertical gate structure in which a portion of the transfer gate electrode 120 may be embedded in the semiconductor substrate unlike another gate electrode 150. For example, the transfer gate electrode 120 may extend in a direction perpendicular to an upper surface of the photodiode 170 as illustrated in FIG. 11.

The transfer gate electrode 120 may be formed in a space between the first and second areas 113 and 115 included in the floating diffusion 110. Thus, the first and second areas 113 and 115 may be disposed in different positions based on the transfer gate electrode 120. The first and second areas 113 and 115 may be disposed on different sides of the transfer gate electrode 120. According to some embodiments of the present inventive concept, the first and second areas 113 and 115 may be disposed symmetrically with respect to the transfer gate electrode 120. Thus, when charges generated by the photodiode 170 are transferred to the floating diffusion 110, variations in the charge transfer paths through which the charges may be transferred may be reduced, and charge transfer efficiency may be increased. Accordingly, image lag may be reduced or possibly prevented.

Figure 12:
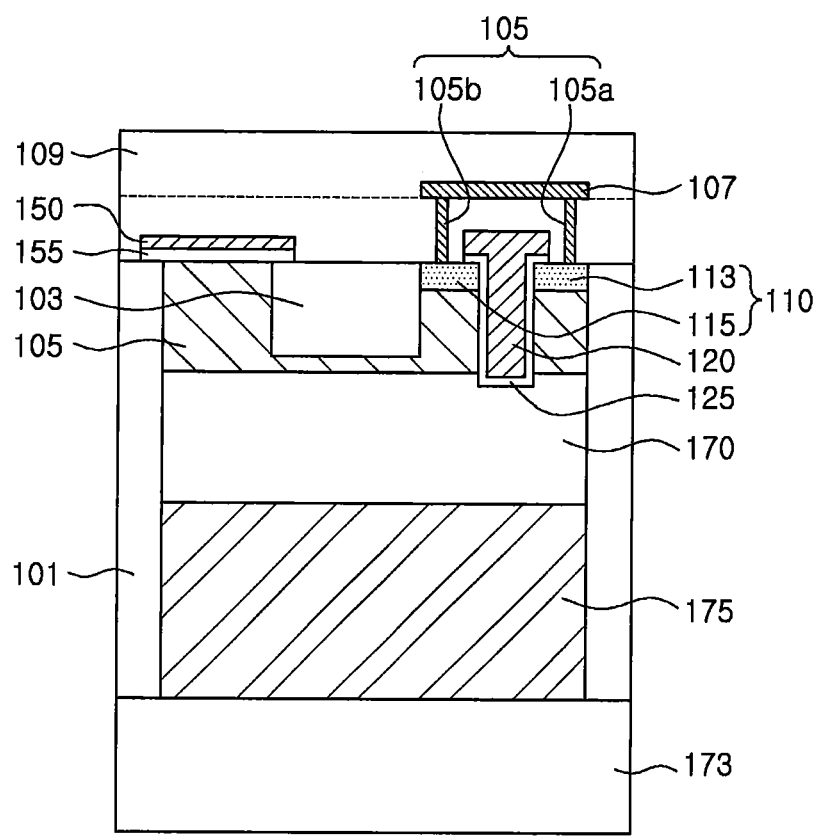

Referring to FIG. 12, the first and second areas 113 and 115 may be connected to the first and second contacts 105a and 105b, respectively. The first and second contacts CT1 and CT2 may be electrically connected to each other by a conductive line 107, and thus the first and second areas 113 and 115 may provide a floating diffusion 110. For example, the floating diffusion 110 having the first and second areas 113 and 115 may be provided as a single node as illustrated in FIGS. 2A through 2C. The pixel 100 may include an insulating layer 109 formed thereon.

Figure 13:
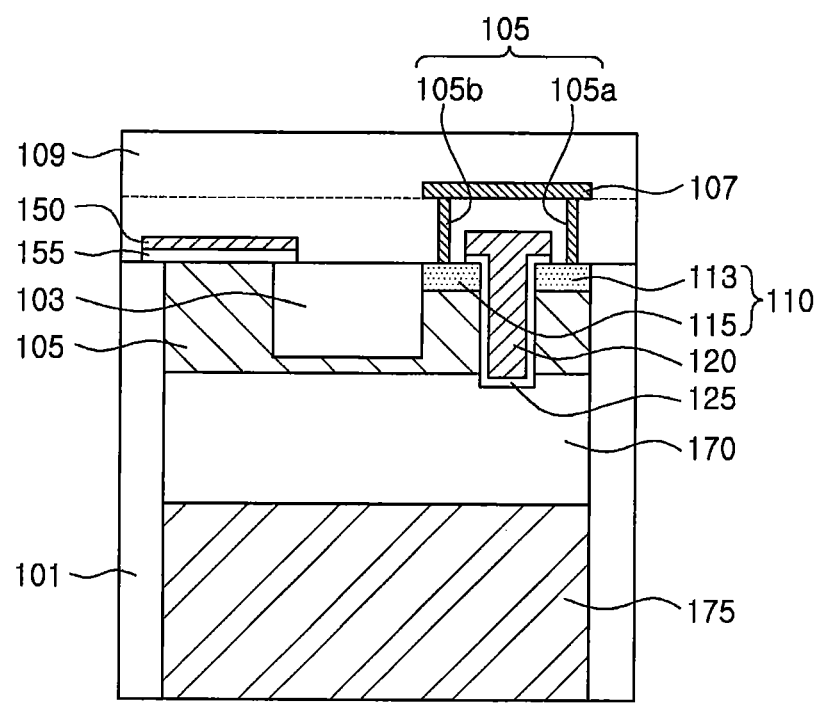

Referring now to FIG. 13, the silicon substrate 173 may be removed from the semiconductor substrate. The silicon substrate 173 may be eliminated using, for example, a mechanical grinding process and/or a chemical method. According to some embodiments of the present inventive concept, the silicon substrate 173 may be removed and the epitaxial layer 175 may be exposed using, for example, a mechanical method using a polishing pad or a chemical method using a chemical substance, for example, slurry. After removal of the silicon substrate 173, an additional etching process may be performed to eliminate pollutants remaining on a lower surface of the epitaxial layer 175.

Figure 14:
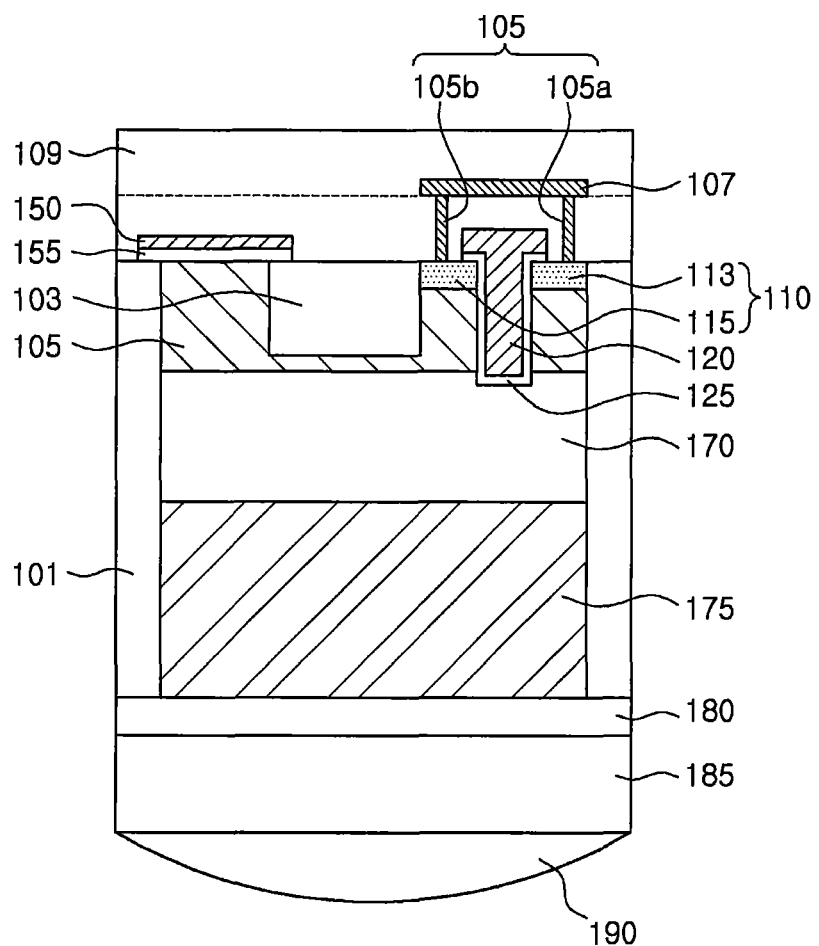

When the lower surface of the epitaxial layer 175 is exposed, the antireflection layer 180, the color filter 185, and the microlens 190 may be sequentially formed on the lower surface of the epitaxial layer 175 as illustrated in FIG. 14. The antireflection layer 180 may reduce or possibly prevent reflection of light incident on the microlens 190 and the color filter 185. According to some embodiments of the present inventive concept, a doped layer or an insulating layer including p-type impurities may be further provided to reduce or possibly prevent dark current between the lower surface of the epitaxial layer 175 and the antireflection layer 180.

The color filter 185 may be disposed in each pixel 100, and thus the plurality of color filters 185 may be disposed in a matrix form to provide a color filter array in the pixel array 11 of FIG. 1 in which the plurality of pixels 100 are disposed. The plurality of color filters 185 may be disposed in a Bayer pattern including red, green, and blue filters in the color filter array, or may further include a yellow filter, a magenta filter, a cyan filter, and the like.

The microlens 190 may control an incident path of light such that light transmitted from the object 30 may be efficiently transmitted to the photodiode 170. The microlens 190 may be provided in each pixel 100 so that the plurality of microlenses 190 may provide a microlens array in the pixel array 11 of FIG. 1.

Figure 15:
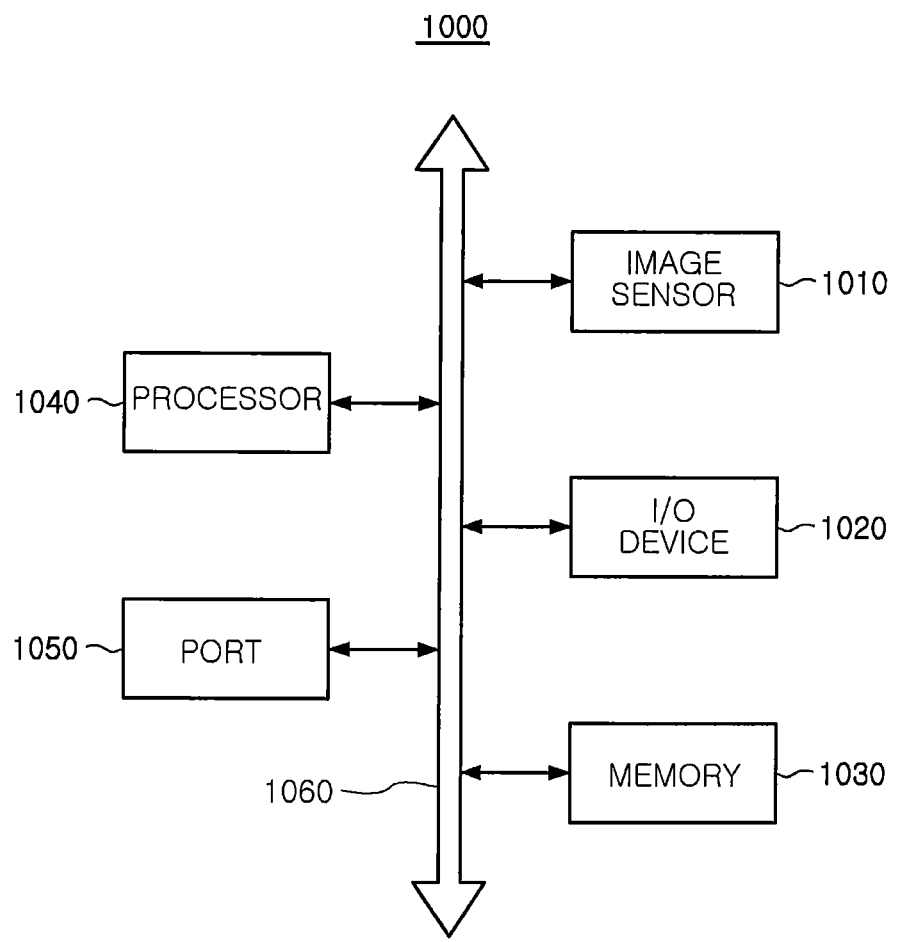
FIGS. 15 and 16 are diagrams illustrating electronic devices to which an image sensor according to some embodiments of the present inventive concept may be applied.
Figure 16:
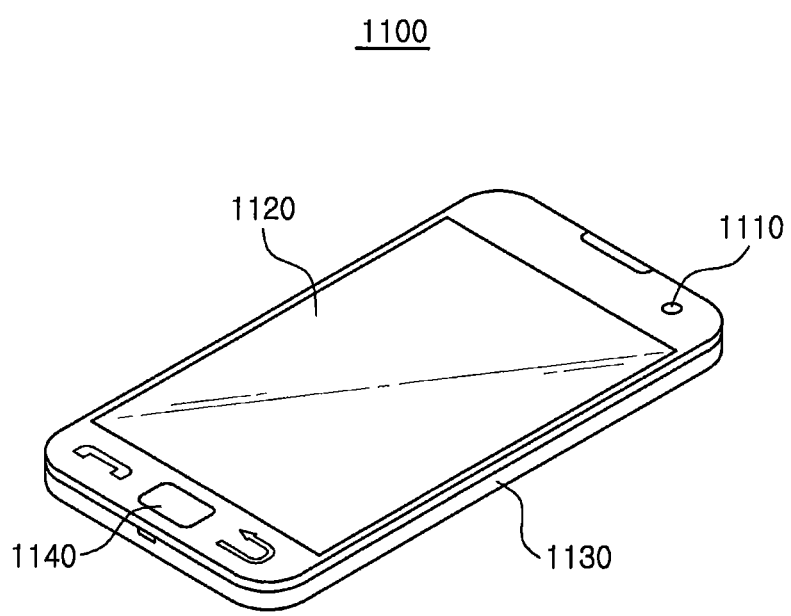

FIGS. 15 and 16 are diagrams respectively illustrating electronic devices to which an image sensor according to some embodiments of the present inventive concept may be applied.

Referring to FIG. 15, an image sensor 1010 according to some embodiments of the present inventive concept may be applied to a computer device 1000. The computer device 1000 according to some embodiments of the present inventive concept illustrated in FIG. 15 may include an I/O (Input/Output) device 1020, a memory 1030, a processor 1040, a port 1050, and the like, in addition to the image sensor 1010. The computer device 1000 may further include a wired or a wireless communications device, a power supply, and the like. Among components illustrated in FIG. 15, the port 1050 may be provided for the computer device 1000 to communicate with a video card, a sound card, a memory card, a universal serial bus (USB) device, and the like.

The processor 1040 may perform a certain operation, command, and task, and the like. The processor 1040 may be a central processing unit (CPU) or a microprocessor unit (MCU), and may communicate with the memory 1030, the I/O device 1020, the image sensor 1010, and other devices connected to the port 1050, through a bus 1060.

The memory 1030 may be a storage medium storing data necessary for operations of the computer device 1000, or multimedia data. The memory 1030 may include a volatile memory such as a random access memory (RAM) or a non-volatile memory such as a flash memory. In addition, the memory 1030 may include at least one of a solid state drive (SSD), a hard disk drive (HDD), and an optical disk drive (ODD), as a storage device. The I/O device 1020 may include input devices such as a keyboard, a mouse, and a touch screen and output devices such as a display and an audio output unit provided to a user.

The image sensor 1010 may be connected to the processor 1040 by the bus 1060 or other communications units. The processor 1040 may perform a function of the image processor 20 illustrated in FIG. 1. The image sensor 1010 may be one of embodiments of the present inventive concept and may include the pixels 100, 200, and 300 as described with reference to FIGS. 2A through 2C and FIGS. 3 through 8.

For example, the image sensor 1010 may include the floating diffusions 110, 210, and 310 each having the plurality of areas disposed in different directions based on each of the transfer gate electrodes 120, 220, and 320 having the vertical structures, respectively. Thus, variations in the charge transfer paths through which charges generated by the photodiodes 170, 270, and 370 may be transferred to the floating diffusions 110, 210, and 310 may be reduced to increase charge transfer efficiency, thereby reducing and possibly preventing image lag.

Referring to FIG. 16, an image sensor according to some embodiments of the present inventive concept may be applied to a portable electronic device 1100. The portable electronic device 1100 may include a camera device 1110 capturing an image, a display device 1120 outputting an image, a housing 1130, an input device 1140, and the like.

Most of the latest electronic devices (e.g., the device 1100) may include the camera device 1110 capturing an image, and the camera device 1110 may include an image sensor. In particular, due to the features of the portable electronic device 1100 having a limited hardware form factor, it is important to reduce or possibly prevent performance deterioration of the image sensor while reducing an area of the image sensor. According to some embodiments of the present inventive concept, the vertical structures may be employed in the transfer gate electrodes 120, 220, and 320, respectively, to increase a degree of integration of the respective pixels 100, 200, and 300 and may reduce variations in the charge transfer paths, thereby reducing or possibly preventing image lag.

As set forth above, according to various embodiments of the present inventive concept, charges may be transferred to a floating diffusion having a plurality of areas disposed in different directions based on a transfer gate electrode to increase charge transfer efficiency, thereby reducing image lag.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. An image sensor comprising:
 a semiconductor substrate including a plurality of pixel areas;
 a photodiode in the semiconductor substrate in one of the plurality of pixel areas;
 a transfer transistor including a transfer gate electrode, a portion of the transfer gate electrode being in the semiconductor substrate and extending toward the photodiode; and
 a floating diffusion configured to accumulate charges transferred from the photodiode, the floating diffusion including a first area and a second area disposed on different sides of the transfer gate electrode.

2. The image sensor of claim 1, wherein the first and second areas are separated from each other.

3. The image sensor of claim 2, wherein the first and second areas are electrically connected to each other.

4. The image sensor of claim 2, wherein the first and second areas are symmetrical with respect to the transfer gate electrode.

5. The image sensor of claim 1, wherein the first and second areas have substantially the same size.

6. The image sensor of claim 1, wherein the first and second areas are connected to each other and comprise a single area.

7. The image sensor of claim 6, wherein the transfer gate electrode extends through the floating diffusion.

8. The image sensor of claim 1, wherein the first and second areas are connected to first and second contacts, respectively, and the first and second contacts are electrically connected through a conductive line.

9. The image sensor of claim 8, wherein the first and second contacts are symmetrically disposed with respect to the transfer gate electrode.

10. The image sensor of claim 1, wherein the semiconductor substrate comprises a first surface and a second surface opposite the first surface, and the transfer gate electrode and the floating diffusion are adjacent to the first surface.

11. The image sensor of claim 10, wherein a portion of the floating diffusion is exposed by the first surface.

12. The image sensor of claim 10, further comprising a color filter on the second surface and a microlens on the color filter.

13. The image sensor of claim 1, further comprising:
 a reset transistor configured to reset the floating diffusion in response to a reset control signal; and
 a driving transistor configured to generate a pixel signal in response to a voltage of the floating diffusion.

14. The image sensor of claim 1, wherein the semiconductor substrate comprises an isolation area separating the plurality of pixel areas from each other.

15. An image processing device comprising:
 an image sensor including a plurality of pixels, each of the plurality of pixels comprising:
  a photodiode configured to generate charges in response to incident light;
  a transfer transistor including a transfer gate electrode extending toward the photodiode;
  a floating diffusion configured to accumulate charges transferred from the photodiode, the floating diffusion including a first area and a second area disposed on different sides of the transfer gate electrode; and
  a driving transistor configured to generate a pixel signal in response to a voltage of the floating diffusion; and
 a processor configured to generate image data in response to the pixel signal.

16. An image sensor comprising:
 a pixel comprising:

a photodiode in a substrate, the photodiode being spaced apart from a surface of the substrate;

a first floating diffusion and a second floating diffusion adjacent the surface of the substrate; and a transfer gate electrode extending from the first floating diffusion and the second floating diffusion to the photodiode, the first floating diffusion and the second floating diffusion being on respective opposing sides of the transfer gate electrode when viewed in cross section.

17. The image sensor of claim 16, wherein the first floating diffusion and the second floating diffusion are spaced apart from each other.

18. The image sensor of claim 17, wherein the first floating diffusion and the second floating diffusion are electrically connected to a conductive line.

19. The image sensor of claim 16, wherein each of the first floating diffusion and the second floating diffusion comprises a portion of a floating diffusion having a unitary structure.

20. The image sensor of claim 19, wherein the transfer gate electrode extends through the floating diffusion.

* * * * *